United States Patent [19]
Klank

[11] 4,161,698
[45] Jul. 17, 1979

[54] TUNING CIRCUIT FOR SUPERHETERODYNE RECEIVER

[75] Inventor: Otto Klank, Arple, Fed. Rep. of Germany

[73] Assignee: Licentia, Patent-Verwaltungs-G.m.b.H., Frankfurt, Fed. Rep. of Germany

[21] Appl. No.: 767,838

[22] Filed: Feb. 11, 1977

Related U.S. Application Data

[63] Continuation-in-part of Ser. No. 608,350, Aug. 27, 1975, abandoned.

[30] Foreign Application Priority Data

Aug. 31, 1974 [DE] Fed. Rep. of Germany ....... 2441809
Feb. 17, 1976 [DE] Fed. Rep. of Germany ....... 2606230

[51] Int. Cl.$^2$ .......................... H04B 1/06; H04B 1/16; H03B 3/04
[52] U.S. Cl. .................................... 325/468; 325/452; 325/418; 331/1 A
[58] Field of Search .................. 325/17, 335, 418–420, 325/423, 452–457, 459, 465, 468, 469; 331/1 A; 334/16; 328/45

[56] References Cited

U.S. PATENT DOCUMENTS

| | | |
|---|---|---|
| 3,488,605 | 1/1970 | Schwartz ................. 331/17 |
| 3,641,434 | 2/1972 | Yates et al. ............. 325/25 X |
| 3,918,006 | 11/1975 | Munninghoff et al. ....... 331/1 A |
| 3,942,121 | 3/1976 | Bell et al. ................ 325/419 |
| 3,949,296 | 4/1976 | McClaskey et al. .......... 325/17 |
| 3,980,951 | 9/1976 | Breeze et al. ........... 325/419 X |
| 4,121,162 | 10/1978 | Alberkrack et al. ......... 325/468 X |

FOREIGN PATENT DOCUMENTS

1210803 11/1970 United Kingdom.

OTHER PUBLICATIONS

*Introduction to Switching Theory & Logic Design,* by Hill & Peterson, Wiley & Sons, ©1968, p. 111.
*Designing with TTL Integrated Circuits,* Morris & Miller, McGraw-Hill, ©1971, pp. 258–259.
NTZ, 1972, vol. 25, No. 11, pp. 507 and 508.

*Primary Examiner*—Robert L. Griffin
*Assistant Examiner*—Aristotelis M. Psitos
*Attorney, Agent, or Firm*—Spencer & Kaye

[57] ABSTRACT

A fine tuning circuit for a superheterodyne receiver including an oscillator whose output frequency is automatically regulated to the value of the rated frequency when the frequency of the oscillator deviates from the rated tuning frequency assigned the receiving channel by means of a control arrangement including a counter for periodically producing a count representative of the oscillator output frequency in a manner such that successive counting states of the counter correspond to oscillator frequency differences which are smaller than the frequency differences between adjacent rated tuning frequency values and with selected counting states being associated with the rated tuning frequency values, and a signal generating arrangement for deriving the control voltage from the counting state of the counter. The counter provides its count in a coded form and the signal generating arrangement is responsive to only part of the counter states which appear when there are deviations from the rated frequency to generate the control voltage.

14 Claims, 5 Drawing Figures

| E | A | D | C | B | |
|---|---|---|---|---|---|
| 0 | 0 | 0 | 0 | 0 | } −Δf |
| 1 | 0 | 0 | 0 | 1 | |
| 2 | 1 | 0 | 1 | 0 | } +Δf |
| 3 | 1 | 0 | 1 | 1 | |
| 4 | 1 | 1 | 0 | 0 | RATED FREQUENCY |
| 5 | 1 | 0 | 0 | 0 | } −Δf |
| 6 | 1 | 0 | 0 | 1 | |
| 7 | 0 | 0 | 1 | 0 | } +Δf |
| 8 | 0 | 0 | 1 | 1 | |
| 9 | 0 | 1 | 0 | 0 | RATED FREQUENCY |
| 0 | 0 | 0 | 0 | 0 | } −Δf |
| 1 | 0 | 0 | 0 | 1 | |
| 2 | 1 | 0 | 1 | 0 | |

TUNING CIRCUIT FOR SUPERHETERODYNE RECEIVER

CROSS-REFERENCE TO RELATED APPLICATION

This application is a continuation-in-part of applicant's copending U.S. Pat. application Ser. No. 608,350, filed Aug. 27th, 1975, now abandoned.

BACKGROUND OF THE INVENTION

The present invention relates to a tuning circuit for a superheterodyne radio receiver, and more particularly to such a tuning circuit with automatic frequency control (AFC) of the local oscillator.

A tuning circuit for a superheterodyne receiver with automatic frequency control is described in applicant's above-identified parent application Ser. No. 608,350, the subject matter of which is hereby incorporated by reference. According to the system described in that application the local oscillator frequency is automatically regulated, by means of a control voltage, to the value of the rated frequency associated with the receiving channel, i.e. the received frequency, if there is a deviation of the oscillator frequency from the rated frequency. The control voltage is generated on the basis of the deviation of the oscillator frequency from the rated frequency.

The invention in the above-identified application resides in the provision of a counter which counts the local oscillator oscillations and from whose counter state the control voltage is derived. The frequency steps counted by the counter are here smaller than the frequency steps between the rated frequencies to which certain counter states are associated. This eliminates a significant drawback of known AFC circuits in which, if there are two stations close together on the frequency scale, the receiver is inevitably tuned to the station having the strongest receiving field.

SUMMARY OF THE INVENTION

It is the object of the present invention to improve the tuning circuit according to the above-mentioned United States Patent Application so that the drawbacks of the known AFC circuits can be overcome with less expense.

The above object is achieved according to the present invention in that in a fine tuning circuit for a superheterodyne receiver including a local oscillator having a control input and control means for supplying a control voltage to the control input for regulating the frequency of the local oscillator to the value of the rated tuning frequency when the tuning frequency of the oscillator deviates from the rated tuning frequency assigned to the receiving channel, and with the control means including a counter for periodically producing a count representative of the oscillator output frequency in a manner such that successive counting states of the counter correspond to oscillator frequency differences smaller than the differences between adjacent rated tuning frequency values and with selected counting states being associated with the rated tuning frequency values, and signal generating means responsive to the counting state of the counter for generating the control voltage to correct a deviation in the oscillator output frequency from the rated tuning frequency value; the counter has a plurality of outputs providing signals representing its counting state in a coded form; and the signal generating means is responsive to only some of said signals representing the counting states which appear when there are deviations from the rated tuning frequency values for generating the control voltage.

Due to the fact that it is not the complete counting state of the counter but only part of it — and in coded form — which is utilized to produce the control voltage, the tuning circuit disclosed in the above-identified parent application can be simplified in an advantageous manner. It is possible, for example, to eliminate the decoder.

DESCRIPTION OF THE PREFERRED EMBODIMENTS

Figure 1:
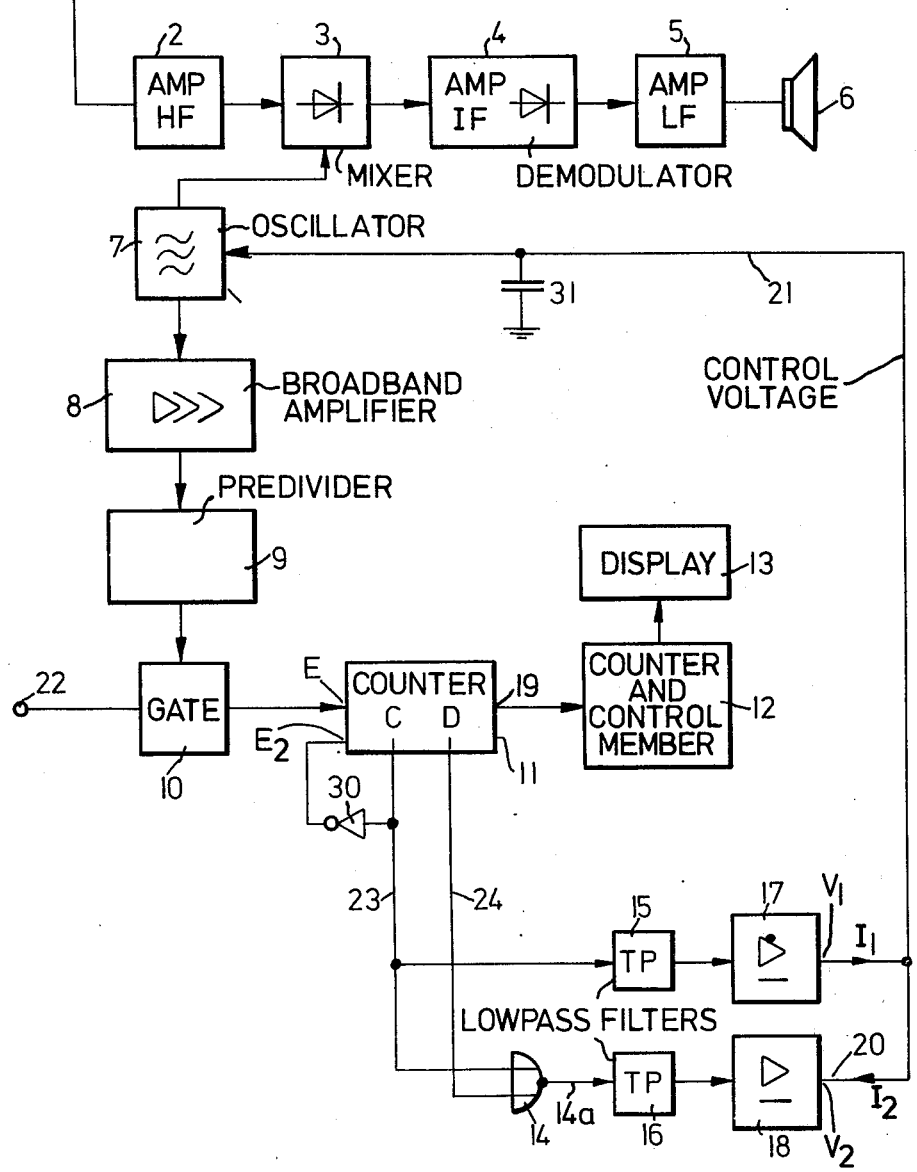
FIG. 1 is a block circuit diagram of a superheterodyne receiver with a tuning circuit according to the invention.

As shown in FIG. 1 the high frequency signal received by an antenna 1 of a superheterodyne radio receiver is fed to a high frequency amplifier 2 and then to a mixer stage 3. The mixer stage 3 is followed by an IF amplifier and demodulation stage 4 and a low frequency amplifier stage 5 whose output signal is fed to a loudspeaker 6.

In order to produce the intermediate frequency signal, a mixer stage 3 receives the output signal, i.e. the oscillations, from a local oscillator 7 whose frequency can be influenced by a control voltage (tuning voltage) supplied via a line 21. The output frequency of oscillator 7 is also fed to a broadband amplifier 8 which converts the oscillator oscillations into rectagular oscillations at the same frequency as the oscillator output so that they can be counted by a counter. The circuit of broadband amplifier 8, which can be used for FM as well as AM operation, is described in detail in U.S. Pat. No. 3,949,307, issued Apr. 6th, 1976 to Otto Klank and Dieter Rottmann.

The digital output signals from the broadband amplifier 8 reach a frequency predivider 9 whose dividing ratio can be set to various values. The output of predivider 9 is connected to a gate 10 whose control input 22 is connected to receive control pulses which control the gate so that the divided rectangular oscillations from predivider 9 reach the input $E_1$ of a counter 11 only during a certain period of time, the gating period, in order to be counted by the counter 11. The periodically repeated gating period may be 10 ms, for example. The pulse generator (not shown) for generating the 10 ms pulses applied to input 22 may be, for example, a quartz oscillator with a series-connected frequency divider.

For further explanation of the operation of the circuit of FIG. 1 it is assumed that the superheterodyne radio receiver is set to the VHF band. The dividing ratio of predivider 9 is assumed to be 100:1. The size of the frequency steps counted by counter 11 with a gating period of 10 ms is 10 kHz, i.e. after every 10 kHz counter 11 receives a counting pulse. When a station is being accurately received — i.e. if oscillator 7 oscillates at its rated frequency — the counting state of counter 11 corresponds to decimal four or nine for reasons which will be explained in detail below. Between these two counting states there are five counting steps (frequency steps of 10 kHz each) which corresponds to a channel separation of 50 kHz. Most stations in the VHF band will differ from one another by 100 kHz, but in some cases they are spaced as closely as 50 kHz which is the reason why a channel separation of 50 kHz has been chosen. Consequently successive counting states of the counter 11 correspond to oscillator frequency differences which are smaller than the differences between adjacent rated tuning frequency values.

Counter 11 also effects a frequency division at a ratio of 10:1. From its output 19, pulses travel to a counting and regulating member 12 which, in conjunction with counter 11, determines the received frequency and causes same to be optically displayed on a display 13. The received frequency is obtained by counting the output oscillations of oscillator 7 and subtracting the intermiediate frequency therefrom. Circuits for the counting and control member 12 and the display 13 are well known in the art. For example, this circuit may be realized by the integrated circuit AY-5-8101 which is described in the book "MOS DATA 1976" of the General Instrument Corporation. This integrated circuit is available on the market.

Figures 2, 5:
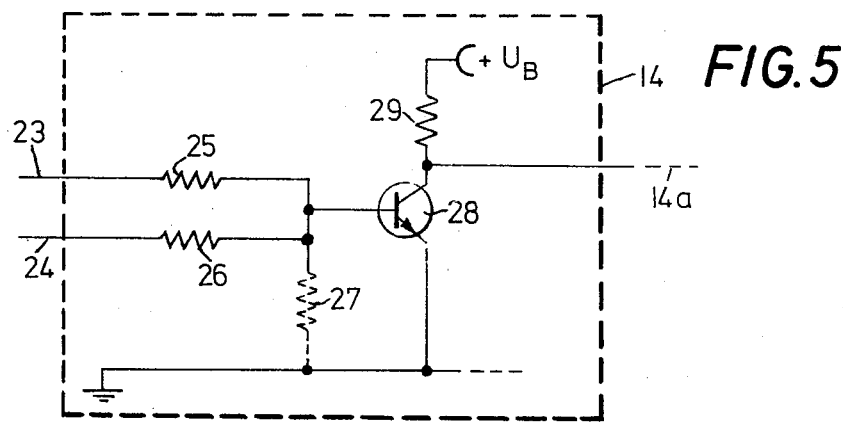
FIG. 2 is a chart showing the coded counter states of a counter, as used in the present invention, in dependence on the counting pulses fed to the counter.
FIG. 5 is a circuit diagram for a NOR gate used in the tuning circuit according to the invention.

Counter 11, whose structure will be explained in detail below with regard to FIGS. 3 and 4, likewise provides output signals which are used to control the frequency of the local oscillator 7. For this purpose, counter 11 is provided with, inter alia, two output terminals C and D, which are connected to the outputs of two stages of the counter 11, at which various combinations of logic signals "0" and "1" may appear depending on the counter or counting state. The various possible signals for the counter state of counter 11 are shown in FIG. 2. As shown in FIG. 2, with rated tuning frequencies provided at spacings of 50 kHz for the associated receiving frequencies for the various receivable stations, a logic "0" is present at output terminal C and a logic "1" at output terminal D. At these values, which each represent, in coded form, part of the counter state of counter 11 corresponding to decimal four or nine, no control voltage is generated to change the frequency of oscillator 7.

In order to recognize the output signals at terminals C and D of counter 11 and produce a control voltage for oscillator 7 if necessary, the two output terminals C and D are connected, via a NOR gate 14, to a lowpass filter (integrating member) 16 to whose output a direct voltage amplifier 18 is connected. With the logic signals associated with counter states of counter 11 corresponding to decimal four and nine, a logic "0" appears at the output 14a of NOR gate 14 which corresponds to a level of about 0 volt. The lowpass filter 16 is therefore unable to produce an output voltage. The other lowpass filter 15, which is controlled directly by output terminal C, produces no voltage due to the "0" potential at output C at these counter states.

If, however, the frequency of oscillator 7 deviates from the rated tuning frequency, i.e., if the counter state of counter 11 does not correspond to decimal four or nine, a control voltage is generated to tune the frequency of oscillator 7 to the value of the rated frequency. At the counting states of counter 11 corresponding to decimal two and three or seven and eight, the output terminal C of counter 11 is at logic "1" and output terminal D is at logic "0". Output 14a then continues to be at "0" potential so that no voltage appears at the output of lowpass filter 16, but lowpass filter 15, due to the logic "1" it receives in the form of a positive voltage level via output C of counter 11, produces a positive voltage which is amplified by a series-connected direct voltage amplifier 17 and which appears in its output line as control voltage $V_1$ or as a regulated change of a certain basic voltage. Since the logic "1" appears periodically at output terminal C, lowpass filter 15 receives pulses consecutive in time. From these pulses, lowpass filter 15, due to its integrating effect produces a direct voltage which is fed to amplifier 17 to produce control voltage $V_1$. Voltage $V_1$ is fed via line 21 to control the oscillator 7 whose frequency is thus increased until the rated tuning frequency has been reached again. The change in frequency of oscillator 7 may be effected via a voltage dependent variable capacitance diode (not shown) in a coventional manner. When oscillator 7 has reached its rated frequency the counter state of counter 11 again corresponds to decimal four or nine so that no further control voltage is produced.

Whereas at counter states of counter 11 corresponding to decimal two and three or seven and eight the frequency of oscillator 7 is increased, as shown in FIG. 2 by the bracketed + $\Delta f$ values, the counter states of counter 11 corresponding to decimal zero and one or five and six cause a control voltage to be produced, or a change in a basic voltage, respectively, which causes a reduction in the frequency of oscillator 7 if it has deviated from the rated frequency. FIG. 2 shows that at the last-mentioned counter states both output terminals C and D of counter 11 have "0" potential. Thus logic "1" pulses appear at the output 14a of NOR gate 14 which are fed to lowpass filter 16. Due to the integrating effect of lowpass filter 16, the direct voltage amplifier 18 is regulated with a direct current. Compared to direct voltage amplifier 17, direct voltage amplifier 18 effects a reversal in the regulating direction so that the output current $I_2$ in output line 20 has a different polarity than the output current $I_1$ of the direct voltae amplifier 17. Control voltage $V_2$ regulates oscillator 7 to the rated frequency by reducing its actual frequency. The output currents $I_1$ and $I_2$ cause capacitor 31, which is connected to line 21, to be charged or discharged, respectively, so that its voltage is regulated accordingly and constitutes the control voltage. Since at the last-mentioned counter states output terminal C of counter 11 is at "0" potential, lowpass filter 15 does not produce a voltage so that only voltage $V_2$ is effective. The two direct voltage amplifiers 17 and 18, for example, may be of the type CA 3080 manufactured by the RCA Corporation.

If counter or counting states have been mentioned above, this was intended to mean the counter or counting state present at the end of the gating period, which is equal to the counting period, and which state also remains unchanged during the counting interval between two successive gating periods until the beginning of the next gating period. From the beginning of one gating period to its end, counter states corresponding to decimal values between zero and nine appear and the logic signals at output terminals C and D of counter 11 change correspondingly before they reach their final logic position at the end of the gating period. Thus voltage $V_1$ and $V_2$ are being produced already before the final counter state at the end of the gating period is reached. It has been found, however, that these voltages substantially cancel one another out in their statistical average and are thus without any damaging influence. Even if a slight residual voltage remains, it will be without interfering influence on the operation of the tuning circuit.

It is, however, also possible, with logic gates (not shown) to assure that an elevation will take place only at the end of the gating period and thus a control voltage is produced only during periods between counting intervals.

The tuning circuit may also be used for other receiving bands such as shortwave, mediumwave or longwave. For shortwave reception, the dividing ratio of predivider 9 is changed so that, corresponding to a 5 kHz channel separation, the counted frequency steps are 1 kHz. The change in the dividing ratio can advantageously be effected together with the setting of the respective receiving band. Such an arrangement for changing the dividing ratio of a predivider with the change in received frequency bands is described in the U.S. Pat. No. 3,509,484 issued Apr. 28, 1970.

It is also possible to employ a counter with a different counting mode, i.e., other than a decade counter, to set the oscillator frequencies to values which do not correspond to the 5 kHz or 50 kHz channel separation pattern. For example, with a counter counting to nine it is possible to produce a frequency separation pattern with channels spaced at 9 kHz which in part corresponds to the mediumwave band. A combination of various separation patterns is also possible.

According to another possibility, for tuning in the mediumwave band among stations having broadcast frequencies arranged in a plurality of nested patterns with different frequency separations, the circuit can be composed of a plurality of counters 11 connected in parallel, connected to the counters, for providing signals indicating the difference between the oscillator output frequency value and a selected rated tuning frequency value, and this deviation information is combined, either directly or via logic gates, in order to derive the control voltage to regulate the frequency of oscillator 7 to the rated tuning frequency value.

The counter 11 used in the tuning circuit will now be explained in detail with the aid of FIGS. 3 and 4. FIG. 3 shows a known decimal counter which may be, for example, of the type SN 7490 manufactured by Texas Instruments Corp. The decimal counter 11' is realized in a known manner by connecting together four flip-flops FF1-FF4, of which the first flip-flop FF1 forms a counter to decimal two and the other three flip-flops FF2-FF4 form a counter to decimal five. Since it is known that a counter can also be used as a divider stage, the pulses fed to the counting input E appear at the output 19' of counter 11' divided at a ratio of 10:1. Counter 11' has four output terminals A, B, C, D whose logic occupation identifies the counter state of counter 11' and represents the number of counted pulses in the conventional binary code.

Figure 3:
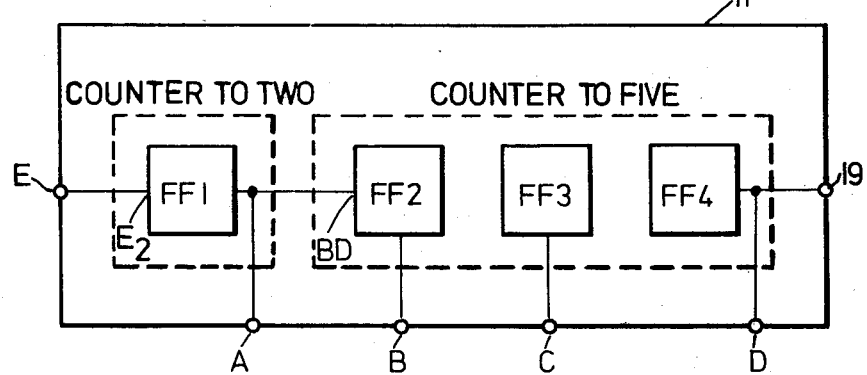
FIG. 3 is a block circuit diagram of a known decimal counter.
Figure 4:
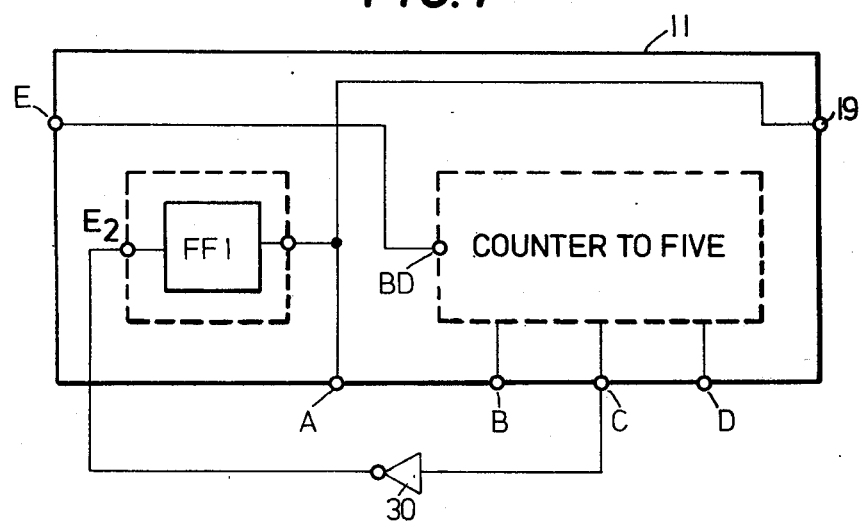
FIG. 4 is a block circuit diagram of a counter as used in the present invention.

The known decimal counter 11' of FIG. 3 is modified according to the invention as shown in FIG. 4 so that it is possible to utilize only part of the signals indicating the counter state in coded form at output terminals A through D in order to obtain the control information. This is accomplished in that the counting pulses fed to input E$_1$ of counter 11 from the gate 10 of FIG. 1 are fed directly to input BD of the three stage counter (FF2-FF4) which counts to decimal five. Furthermore, output terminal C which in the known counter 11' has a value of decimal four in the binary system (a logic "1" appears at output terminal C of the known counter 11' at the counter state corresponding to decimal four while the other output terminals lie at "0" potential) is connected via an inverter 30 with the input E$_2$ of the counter counting to decimal two (flip-flop stage FF1). In this way, the logic occupation of output terminals A-D shown in FIG. 2 is obtained in dependence on the counting pulses fed to input E$_1$. It is sufficient to utilize the boxed-in logic signals "0" and "1" at the output terminals C and D as shown in FIG. 2 to produce the control voltage so that the output terminals A and B will not be required for this purpose. Since evaluation is effected directly based on the logic potentials, no decoder is required so that the tuning circuit disclosed in the above identified copending United States parent application is significantly simplified.

By connecting the output terminal C of counter 11 via inverter 30 with the input E$_2$ of flip-flop FF1, it is possible to cause the counter 11 of FIG. 4 to likewise divide the frequencies of the pulses it receives at input E$_1$ at a ratio of 10:1. The frequency divided pulses can be obtained at output 19 which is connected with output terminal A. The frequency division of 10:1 can be seen by the dashed lines around the potentials at output terminal A in FIG. 2. The potential at output terminal A alternates between logic "1" for five counting pulses and then logic "0" for five counting pulses.

Turning now to FIG. 5, there is shown an example of a circuit for the NOR gate 14 of FIG. 1. The signals received through the two input lines 23 and 24, which are connected to the output terminals D and C, respectively, of counter 11, reach the base of a transistor 28 via the series resistors 25, 26, respectively. If necessary, the base of transistor 28 can be connected to a reference potential, e.g., ground, via the resistor 27 shown in dashed lines. The output signals from the NOR gate 14 which appear in output line 14$a$ are received from the collector of transistor 28. As shown, the collector of transistor 28 is connected, via an operating resistor 29, to an operating voltage V$_B$ which approximately corresponds to the positive voltage level associated with a logic "1".

It will be understood that the above description of the present invention is susceptible to various modifications, changes and adaptations, and the same are intended to be comprehended within the meaning and range of equivalents of the appended claims.

What is claimed is:

1. In a tuning circuit for a superheterodyne receiver including a local oscillator having a control input and control means for supplying a control voltage to said control input for regulating the frequency of said local oscillator to the value of the rated tuning frequency when the tuning frequency of said oscillator deviates from the rated tuning frequency assigned to the receiving channel, said control means including signal processing means, the output for receiving the output signal from said oscillator and for deriving therefrom a train of pulses having a frequency proportional to the oscillator output frequency, counting means having a count input connected to the output of said signal processing means, for periodically producing a count representative of the oscillator output frequency in a manner such that successive counting states of said counting means correspond to oscillator frequency differences smaller than the differences between adjacent rated tuning frequency values and with selected counting states being associated with the rated tuning frequency values, and signal generating means responsive to the counting state of said counting means for generating said control voltage to correct any deviation in the oscillator output frequency from the rated tuning frequency value; the improvement wherein: said counting means comprises a first binary counter having three stages which counts only to five; and said signal generating means is connected to only the outputs for the second and third stages of said first counter, and is responsive to the signals representing said counting state appearing at same when a deviation from a rated tuning frequency occurs, for generating said control voltage.

2. A tuning circuit as defined in claim 1 wherein said signal processing means comprises: a predivider for dividing the frequency of said train of pulses according to a dividing ratio which determines the magnitude of the oscillator frequenncy difference between adjacent counting states of said counting means; and a gate means connected between the output of said predivider and said count input of said counting means for permitting passage of such pulses to said count input during successive time intervals of present duration.

3. A tuning circuit as defined in claim 1 wherein said counting means further includes a second binary counter which counts to two, and means for connecting the count input of said second counter to said first counter so that the pulse train supplied to said count input of said first counter appears divided by a ratio of 10:1 at the output of said second counter.

4. A tuning circuit as defined in claim 3 wherein said means for connecting said count input of said second counter comprises an inverter whose input is connected to said output for said second stage of said first counter and whose output is connected to said count input of said second counter.

5. A tuning circuit as defined in claim 4 further comprising means, connected to said output of said second counter, for providing a digital display of the output frequency of said oscillator.

6. An arrangement as defined in claim 3 for tuning in the VHF band among stations having broadcast frequencies spaced 50 kHz apart, wherein said counting means has successive output counting states corresponding to oscillator frequency differences of 10 kHz and the output counting states representing the decimal values "four" and "nine" being the selected output counting states corresponding to successive rated tuning frequency values.

7. An arrangement as defined in claim 3 for tuning in the shortwave band among stations having broadest frequencies spaced 5 kHz apart, wherein said counting means has successive output counting states corresponding to oscillator frequency differences of 1 kHz and the output counting states representing the decimal values "four" and "nine" being the selected output counting states corresponding to successive rated tuning frequency values.

8. A tuning circuit as defined in claim 1 wherein said signal generating means includes: a first lowpass filter having its input connected to said output of said second stage of said first counter and directly controlled by the output signals at same; a NOR gate having two inputs connected to said outputs of said second and third stages of said first counter; and a second lowpass filter having its input connected to the output of said NOR gate.

9. A tuning circuit as defined in claim 8 wherein said signal generating means further includes first and second direct voltage amplifiers for providing direct output voltages of respectively opposite polarity and with each of said direct voltage amplifiers having its input connected to the output of a respective one of said lowpass filters; and means for connecting the outputs of said direct voltage amplifiers to said control input of said local oscillator.

10. A tuning circuit as defined in claim 1 wherein said signal processing means includes a predivider connected to supply pulses to said count input of said counting means, the dividing ratio of said predivider being variable and determining the magnitude of the oscillator frequency difference between adjacent counting states of said counting means.

11. An arrangement as defined in claim 10 wherein said superheterodyne receiver is arranged to receive a plurality of broadcast bands and is equipped with a band-selection switch, and said predivider is connected to having its frequency dividing ratio varied by operation of said switch in a manner to cause the counting states of said counting means to have the same relation to the rated tuning frequency values of said oscillator with respect to all of said broadcast bands.

12. In a fine tuning circuit for a superheterodyne receiver including a local oscillator having a control input and control means for supplying a control voltage to said control input for regulating the frequency of said local oscillator to the value of the rated tuning frequency when the tuning frequency of said oscillator deviates from the rated tuning frequency assigned to the receiving channel, said control means including counting means for periodically producing a count representative of the oscillator output frequency in a manner such that successive counting states of said counting means correspond to oscillator frequency difference smaller than the differences between adjacent rated tuning frequency values and with selected counting states being associated with the rated tuning frequency values, and signal generating means responsive to the counting state of said counting means for generating said control voltage to correct any deviation in the oscillator output frequency from the rated tuning frequency value; the improvement wherein: said counting means comprises a binary counter having three stages which counts only to five; and said signal generating means is connected to only the outputs of the second and third stages of said counter and includes first means for directly deriving the control voltage for one direction of control of the frequency of said local oscillator from the logic signal at the output of said second stage of said counter, and second means for producing the control voltage for the opposite direction of control of the frequency of said local oscillator from a linkage of the logic signals at the outputs of the second and third stages of said counter.

13. A tuning circuit as defined in claim 12 wherein: said counting means includes a further binary counter which counts to two; an inverter is provided whose input is connected to said output of said second stage of said counter and whose output is connected to the counting input of said further counter; and means for digitally displaying the output frequency of said oscillator are connected to the output of said further counter.

14. A tuning circuit as defined in claim 12 wherein said first means includes a first lowpass filter having its input connected to said output of said second stage of said first counter, and a first direct voltage amplifier for providing a direct output voltage of a first polarity and having its input connected to the output of said first lowpass filter; wherein said second means includes a NOR gate having two inputs connected to said outputs of said second and third stages of said first counter, a second lowpass filter having its input connected to the output of said NOR gate, and a second direct voltage amplifier for providing a direct output voltage of a polarity opposite that of said first polarity and having its input connected to the output of said second lowpass filter; and wherein means are provided for connecting the outputs of said first and second direct voltage amplifiers to said control input of said local oscillator.

* * * * *